United States Patent
Hieda et al.

[11] Patent Number: 6,162,564
[45] Date of Patent: Dec. 19, 2000

[54] MASK BLANK AND METHOD OF PRODUCING MASK

[75] Inventors: Katsuhiko Hieda, Yokohama, Japan; Thomas Fischer, Mechanicsville, Va.; Andreas Grassmann, Bad Abbach, Germany

[73] Assignees: Kabushiki Kaisha Toshiba, Kawasaki, Japan; Siemens Microelectronics, Inc., Cupertino, Calif.

[21] Appl. No.: 08/978,354

[22] Filed: Nov. 25, 1997

[51] Int. Cl.⁷ .................................................. G03F 9/00
[52] U.S. Cl. .............................. 430/5; 430/322; 430/324; 378/35; 428/433
[58] Field of Search ................................ 430/5, 322, 324; 378/35; 428/433

[56] References Cited

U.S. PATENT DOCUMENTS

| | | | |
|---|---|---|---|
| 3,843,916 | 10/1974 | Trotel et al. | 318/640 |
| 4,037,111 | 7/1977 | Coquin et al. | 205/505 |
| 4,080,267 | 3/1978 | Castellani et al. | 204/15 |
| 4,260,670 | 4/1981 | Burnes | 430/5 |
| 4,451,544 | 5/1984 | Kawabuchi | 430/5 |
| 4,708,919 | 11/1987 | Shimkunas et al. | 430/5 |
| 4,875,434 | 10/1989 | Maejima et al. | 118/52 |
| 4,887,283 | 12/1989 | Hosono | 378/35 |
| 4,932,872 | 6/1990 | Waggener | 437/225 |
| 4,964,145 | 10/1990 | Maldonado | 378/35 |
| 5,034,972 | 7/1991 | Schomburg et al. | 378/35 |
| 5,039,203 | 8/1991 | Nishikawa | 359/894 |
| 5,051,326 | 9/1991 | Celler et al. | 430/5 |
| 5,124,561 | 6/1992 | Faure et al. | 250/505.1 |
| 5,178,727 | 1/1993 | Toya et al. | 156/644 |
| 5,234,781 | 8/1993 | Sakamoto et al. | 430/5 |
| 5,306,584 | 4/1994 | Palmer | 430/5 |
| 5,552,247 | 9/1996 | Waldo, III et al. | 430/5 |
| 5,879,840 | 3/1999 | Yabe et al. | 430/5 |
| 5,959,721 | 9/1999 | Nishi | 355/53 |

FOREIGN PATENT DOCUMENTS

| | | |
|---|---|---|
| 58125040 | 1/1982 | European Pat. Off. . |
| 0339953 | 4/1989 | European Pat. Off. . |
| 06019121 | 1/1994 | European Pat. Off. . |
| 53-099772 | 8/1978 | Japan . |
| 58-125040 | 7/1983 | Japan . |
| 6-19121 | 1/1994 | Japan . |

OTHER PUBLICATIONS

IBM; Technical Disclosure Bulletin; "Spinner Cup and Adhesive Frame Uniformly Spin Coating Non–Circular Substrates"; vol. 32 No. 8B; Jan. 1990; pp 429–430.

European Search Report; Application No. EP 98 12 1143; Apr. 7, 1999.

*Primary Examiner*—S. Rosasco
*Attorney, Agent, or Firm*—Banner & Witcoff, Ltd.

[57] ABSTRACT

A shading film of chrome is formed entirely on one surface of a circular substrate of quartz. The substrate is rotated and resist is applied to the shading film. Since the substrate is shaped in a circle, the resist spreads uniformly on the entire surface of the shading film by the centrifugal force. Therefore, the resist has a substantially uniform film thickness over almost the entire surface of the shading film. This resist is patterned to form a resist pattern. By etching the shading film with the resist pattern used as a mask, a pattern preferable in accuracy of dimensions can be formed.

17 Claims, 3 Drawing Sheets

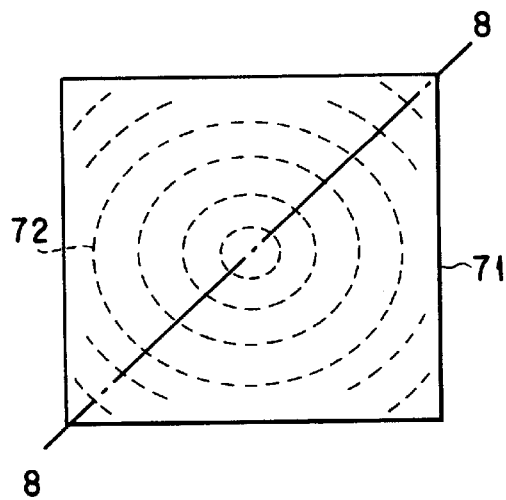
F I G. 7
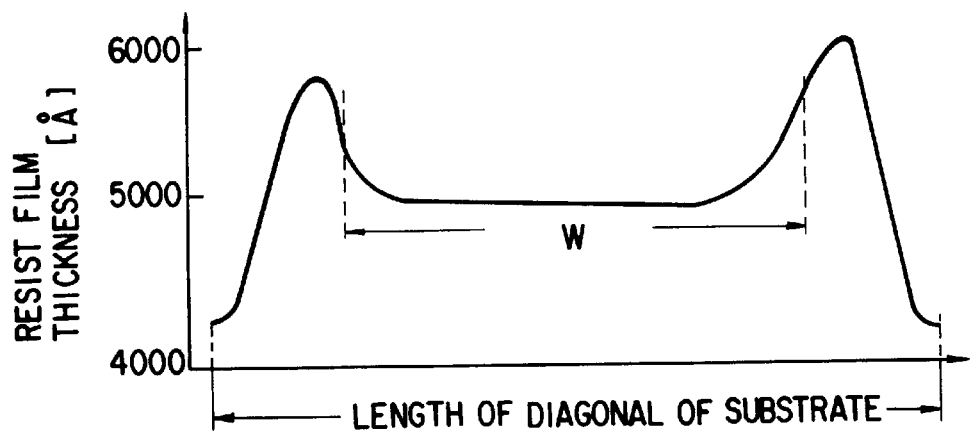
F I G. 8
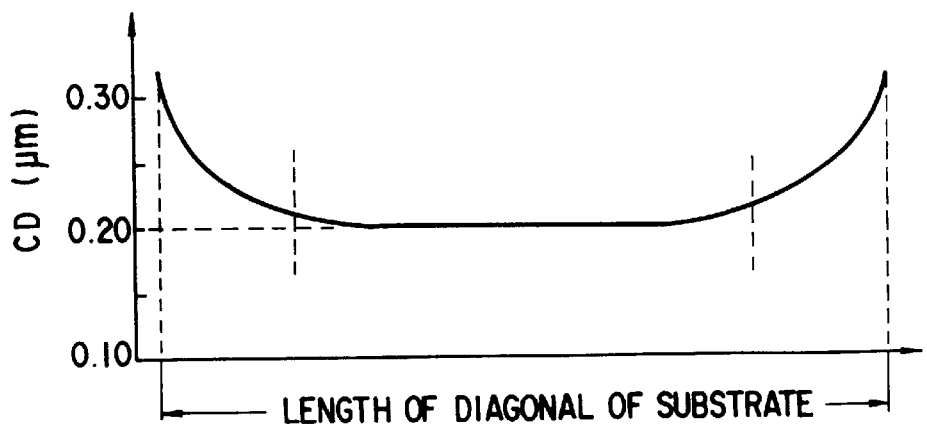
F I G. 9

MASK BLANK AND METHOD OF PRODUCING MASK

BACKGROUND OF THE INVENTION

The present invention relates to a mask blank necessary to form, for example, a photomask and a reticule, and particularly, to modification of the shape of the mask blank.

In this kind of a conventional mask blank, a chrome (Cr) layer is formed as a shading film on a surface of a square substrate of quartz. When a pattern is formed as, for example, a photomask on this mask blank, photoresist is first applied to an entire surface of the mask blank and patterned. With the patterned resist used as a mask, the shading film is processed in, for example, isotropic etching and the resist pattern is transferred to the shading film. The pattern is exposed to a wafer by use of the photomask thus formed.

When resist is applied to the mask blank, a spin coater is used similarly to a case where resist is applied to a wafer. However, when resist is applied to a square mask blank by use of a spin coater, it is difficult to apply the resist with a uniform thickness on an entire surface of the mask blank. That is, on a rotated substrate, the resist does not spread uniformly and omnidirectionally by the centrifugal force and concentrates at angular portions of the substrate. For this reason, the film thickness of the resist at the angular portions is larger than that at a central portion on the substrate.

FIG. 7 shows a state of resist 72 applied to a surface of a conventional mask blank 71 and FIG. 8 shows distribution of the film thickness of the resist 72 as seen along a line 8—8 of FIG. 7. As shown in FIG. 8, the film thickness of the resist can be substantially uniform at the central portion of the mask blank 71, but the film thickness of the resist in the vicinity of the angular portions is larger than that at the central portion. If the film thickness of the resist is non-uniform as mentioned above, it is difficult to exactly transfer a pattern on the resist and impossible to exactly form a resist pattern. Therefore, if the shading film is etched by use of this resist as a mask, accuracy in the size of the pattern formed on this shading film is also worsened. Further, the photomask thus formed is mounted on a stepper and the pattern is projected at a reduced size on a wafer. Recently, a semiconductor device has been very miniaturized. Therefore, if the photomask pattern has an error in accuracy of the size, the pattern formed on a semiconductor wafer also has an error as shown in FIG. 9, and a CD (critical dimension) of the formed pattern is worsened. On the other hand, it is impossible to form the pattern in a region where the film thickness of the resist is non-uniform, and the region where the pattern can be formed on the mask blank is limited to an area represented by W in FIG. 8. For this reason, there is a problem that the design margin in pattern formation is decreased.

BRIEF SUMMARY OF THE INVENTION

The object of the present invention is to provide a mask blank which can improve accuracy in the pattern size by preventing irregularity of a film thickness of resist applied on the mask blank, and a method of producing the mask.

The above object can be achieved by a mask blank comprising a circular transparent substrate; and a film having shading properties, formed entirely on one surface of the substrate.

Further, the above object can be achieved by a method of producing a mask, comprising the steps of: forming a film having shading properties on one surface of a circular transparent substrate; rotating the substrate and applying resist on the film; patterning the resist; and etching the film with the patterned resist used as a mask, and thereby forming a mask pattern.

According to the present invention, a circular mask blank is formed by using a circular substrate. Therefore, when resist is applied on a shading film, the film thickness of the resist can be substantially uniform over almost the entire surface of the shading film. As a result, since a pattern is exactly formed on the shading film, accuracy in the size of the pattern and exposed and thus formed on a wafer can be improved.

In addition, since the film thickness of the resist formed on the shading film is substantially uniform in almost all the regions on the shading film, an area in which the pattern can be formed can be extended on the substrate, and a design margin in pattern formation can be thereby increased.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a plan view showing a conventional mask blank;

FIG. 8 is a graph showing distribution of a film thickness of a conventional mask blank; and FIG. 9 is a graph showing distribution of a pattern a size of a conventional mask blank.

DETAILED DESCRIPTION OF THE INVENTION

An embodiment of the present invention will be described with reference to the drawings.

Figure 1:
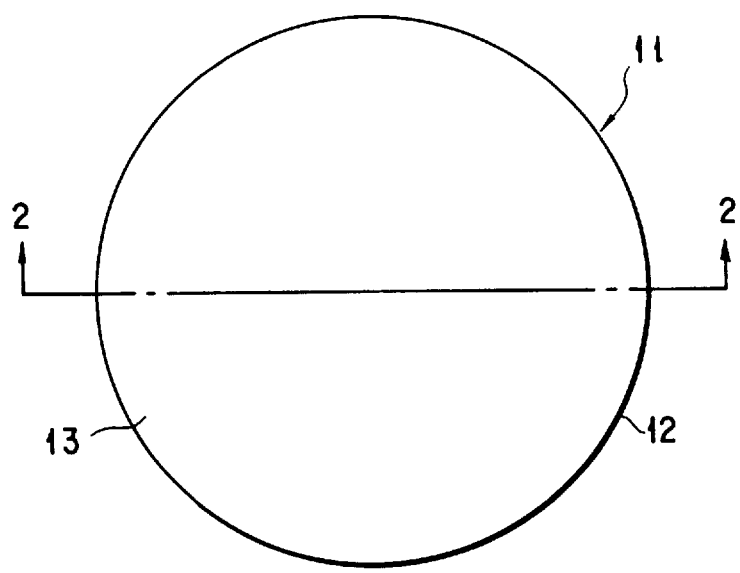
FIG. 1 is a plan view showing an embodiment of a mask blank according to the present invention.
Figure 2:
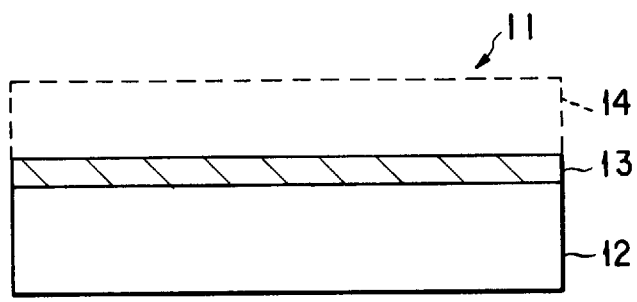
FIG. 2 is a cross-sectional view as seen along a line 2—2 of FIG. 1.

FIGS. 1 and 2 show a mask blank of the present invention. In this mask blank, a shading film 13 having shading properties, formed of laminated films of, for example, chrome and chrome oxide, is formed on an overall surface at one side of a circular substrate 12. The substrate 12 is constituted by quartz having, for example, a thickness of 6.30 mm thick and a diameter of 200 mm, and having transparency. The shading film 13 can be deformed in accordance with the specification of the mask to be formed.

For example, when a half-ton mask is formed, a film having transparency ranging, for example, from 3% to 20%, is formed instead of the shading film 13. For example, Cr-based, MoSi-based or SiN-based materials can be employed for this film. A notch representing a referential position may be formed at one portion of the substrate 12. As shown in FIG. 2, a resist 14 is applied on the shading film 13. In this case, the substrate 12 is mounted on a well-known resist applying device; spin coater (not shown) and the resist with a film thickness of, for example, approximately 5000 Å is spin-coated on the shading film 13. Since the substrate 12 is shaped in a circle and has no angular portions, the resist 14 extends uniformly and omnidirectionally by the centrifugal force on the rotated substrate 12. The resist 14 with a substantially uniform thickness can be thereby formed on almost all over the shading film 13.

Figure 4:
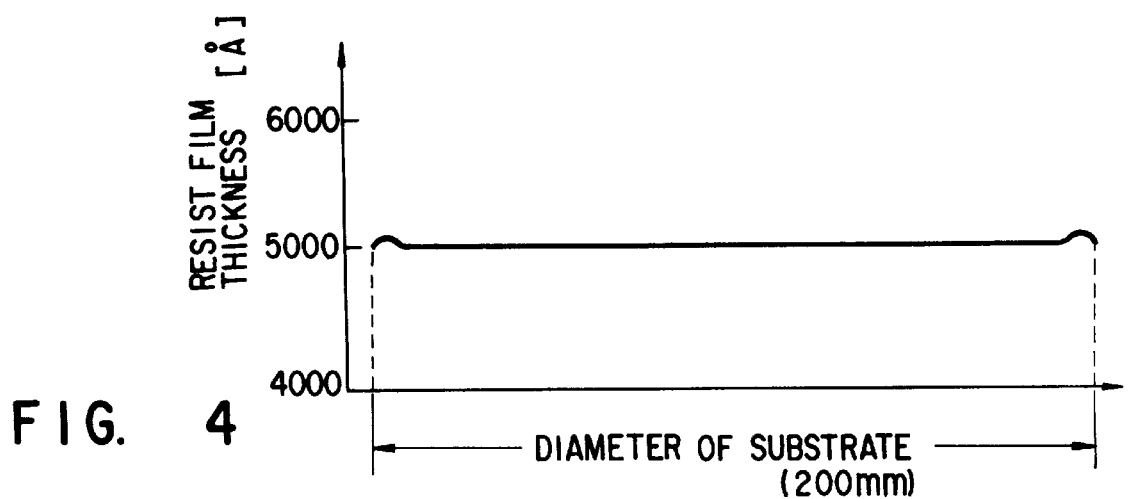
FIG. 4 is a graph showing distribution of a film thickness of the present invention.

FIG. 4 shows a distribution of a film thickness of the resist as seen along a line 2—2 of FIG. 1. As evident from FIG. 4, a film thickness of the resist 14 is substantially uniform almost all over the surface of the mask blank. That is, irregularity in the film thickness of the resist on the mask blank is set at about 5% or less in the regions at about 90% of all the surface of the mask blank.

Figure 3:
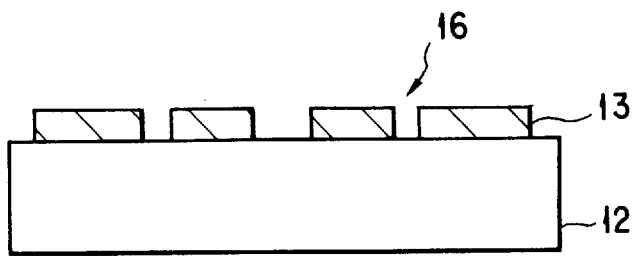
FIG. 3 is a cross-sectional view showing a producing step following that shown in FIG. 2.
Figure 5:
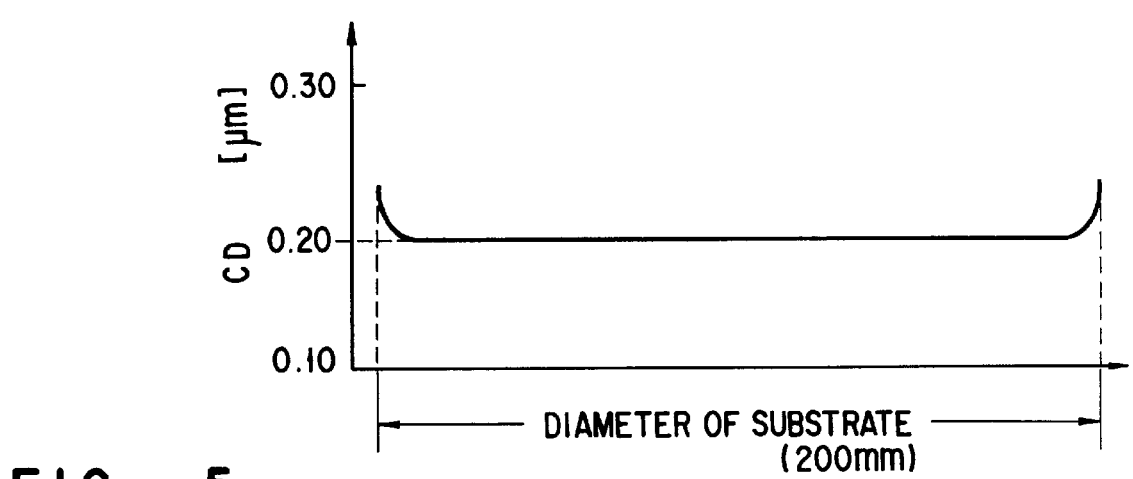
FIG. 5 is a graph showing distribution of a pattern size of the present invention.

After that, a required pattern is transferred on the resist 14 by well-known lithography and a resist pattern is thereby formed. With this resist pattern used as a mask, the shading film 13 is processed by, for example, wet etching, RIE (reactive ion etching) or plasma etching, and as shown in FIG. 3, a desired pattern 16 is formed on the shading film 13 such as the photomask or reticule. The dimensional error is 10% or less in the surface region of the substrate 12 as shown in FIG. 5, and thus a preferable CD can be formed.

Figure 6:
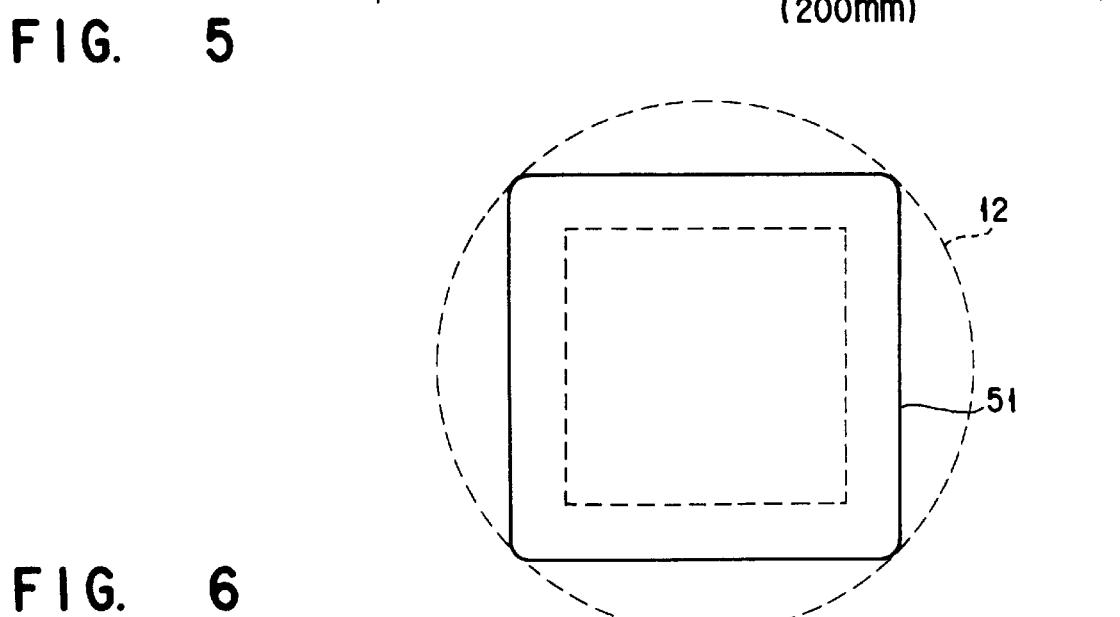
FIG. 6 is a plan view showing another embodiment of the mask blank of the present invention.

The substrate 12 of the photomask or reticule on which the above pattern is formed has a circular outer shape. Even the substrate 12 having such a circular shape can easily and exactly be mounted by only slightly deforming a mask holder provided at a semiconductor wafer tracking device such as a stepper used at present. Otherwise, as shown in FIG. 6 the circular substrate 12 may be cut in a square with each edge being, for example, 6 inches long. It is important to prevent particles from adhering to the mask surface at this cutting. For example, if the resist is applied to the entire surface of the substrate 12 before cutting the substrate 12, adhesion of particles can be prevented. The curvature of the circular substrate can be utilized at the angular portions of a substrate 51 cut in a square. However, the curvature of the angular portions can optionally be varied. Thus, if the substrate is shaped in a square, it can be used without modifying the generally used stepper.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A mask blank comprising:
   circular optically transparent substrate;
   a film having light shielding properties, formed on an entire side surface of the substrate; and
   a resist formed on an entire surface of said film, said resist having a substantially uniform thickness on substantially said entire surface of said film.

2. A mask blank according to claim 1, wherein the film contains chrome.

3. A mask blank according to claim 1, wherein the film has transparency at 3% to 20%.

4. A mask blank according to claim 3, wherein the film is formed of one selected from the group consisting of Cr-based, MoSi-based and SiN-based materials.

5. A mask blank according to claim 1, wherein the thickness of the resist has an allowable error of 5% or less in a region of 90% of said one surface of the film.

6. A method of producing a mask, comprising the steps of:
   forming a film having light shielding properties on an entire side surface of a circular optically transparent substrate;
   rotating the substrate and applying resist on the film;
   patterning the resist; and
   etching the film with the patterned resist used as a mask, and thereby forming a mask pattern.

7. A method according to claim 6, wherein the film contains chrome.

8. A method according to claim 6, wherein the film has transparency at 3% to 20%.

9. A method according to claim 8, wherein the film is formed of one selected from the group consisting of Cr-based, MoSi-based and SiN-based materials.

10. A method according to claim 6, further comprising a resist formed on an entire surface of the film, said resist having a substantially uniform thickness on substanially an entire surface of the film.

11. A method according to claim 10, wherein the film thickness of the resist has an allowable error of 5% or less in a region of 90% of said one surface of the film.

12. A method according to claim 6, wherein the etching is any one of wet etching, RIE and plasma etching.

13. A method according to claim 6, further comprising a step of cutting the circular substrate on which the mask pattern is formed so as to form a square substrate, said square substrate being inscribed in an outer periphery of the circular transparent substrate.

14. A method according to claim 13, wherein angular portions of the square substrate are curved.

15. A mask blank comprising:
   a square optically transparent substrate cut from a circular substrate, said square transparent substrate having angular portions of curvature generally equal to the curvature of said circular substrate;
   a light shielding film formed on an entire side surface of said square transparent substrate; and
   a resist formed on an entire side surface of the film, said resist having substantially uniform thickness over substantially said entire side surface of the film.

16. A method of producing a mask, comprising the steps of:
   forming a film having light shielding properties on an entire side surface of a circular optically transparent substrate;
   rotating the substrate and applying resist on the film;
   patterning the resist;
   etching the film with the patterned resist used as a mask, and thereby forming a mask pattern; and
   cutting the circular substrate so as to form a square substrate, said square substrate being inscribed in an outer periphery of the circular transparent substrate.

17. A method of producing a mask according to claim 16, wherein said resist has a substantially uniform thickness over substantially an entire side surface of the film.

* * * * *